(12) United States Patent
Iwanaga et al.

(10) Patent No.: US 7,637,342 B2
(45) Date of Patent: Dec. 29, 2009

(54) STRADDLE TYPE VEHICLE

(75) Inventors: Sadamu Iwanaga, Shizuoka (JP);
Masami Shinsho, Shizuoka (JP)

(73) Assignee: Yamaha Hatsudoki Kabushiki Kaisha, Shizuoka-Ken (JP)

( * ) Notice: Subject to any disclaimer, the term of this patent is extended or adjusted under 35 U.S.C. 154(b) by 0 days.

(21) Appl. No.: 12/247,874

(22) Filed: Oct. 8, 2008

(65) Prior Publication Data
US 2009/0095553 A1 Apr. 16, 2009

(51) Int. Cl.
*B62M 7/00* (2006.01)

(52) U.S. Cl. .................. 180/229; 180/68.4; 180/219

(58) Field of Classification Search .............. 180/229, 180/68.4, 219; 248/205.1
See application file for complete search history.

(56) References Cited

U.S. PATENT DOCUMENTS

| | | | | |
|---|---|---|---|---|
| 4,641,721 A * | 2/1987 | Yamaguchi | | 180/229 |
| 5,211,255 A * | 5/1993 | Fukuda | | 180/219 |
| 5,782,313 A * | 7/1998 | Kurawaki et al. | | 180/219 |
| 5,845,728 A * | 12/1998 | Itoh et al. | | 180/219 |
| 6,591,934 B2 * | 7/2003 | Tsutsumikoshi | | 180/291 |
| 6,695,089 B2 * | 2/2004 | Adachi et al. | | 180/311 |
| 6,874,362 B2 * | 4/2005 | Myers et al. | | 73/204.27 |
| 7,267,193 B2 * | 9/2007 | Nagashii et al. | | 180/219 |
| 7,370,717 B2 * | 5/2008 | Okuno | | 180/68.4 |
| 7,377,552 B2 * | 5/2008 | Miyabe | | 280/835 |
| 7,398,746 B2 * | 7/2008 | Ohzono | | 123/41.54 |
| 7,484,767 B2 * | 2/2009 | Tsuya | | 280/835 |
| 7,527,115 B2 * | 5/2009 | Tsuya | | 180/68.2 |
| 2003/0121708 A1 * | 7/2003 | Laivins et al. | | 180/229 |
| 2006/0103127 A1 * | 5/2006 | Lie et al. | | 280/781 |
| 2008/0236783 A1 * | 10/2008 | Morita et al. | | 165/41 |
| 2009/0095238 A1 * | 4/2009 | Lak et al. | | 123/41.49 |

FOREIGN PATENT DOCUMENTS

JP 62-066898 4/1987

\* cited by examiner

*Primary Examiner*—Lesley D Morris
*Assistant Examiner*—Tashiana Adams
(74) *Attorney, Agent, or Firm*—Hogan & Hartson LLP

(57) ABSTRACT

A straddle-type vehicle with a radiator having heightened support stiffness. An engine bracket extends vertically and has an upper portion mounted to a front end of a body frame and a lower portion suspending a front wall of an engine. The radiator includes an upper radiator arranged along a front surface of and mounted to the engine bracket, and a lower radiator.

11 Claims, 10 Drawing Sheets

STRADDLE TYPE VEHICLE

CROSS-REFERENCE TO RELATED APPLICATIONS

This application claims the benefit of priority under 35 USC 119 of Japanese patent application no. 2007-264956, filed on Oct. 10, 2007, which is incorporated by reference.

BACKGROUND OF THE INVENTION

1. Field of the Invention

The present invention relates to a straddle-type vehicle having an engine mounted to a body frame through an engine bracket and a radiator device arranged forwardly of the engine.

2. Description of Related Art

In motorcycles having a water-cooled engine, for example, a radiator device for cooling engine-cooling water is generally arranged forwardly of the engine, against which travel wind is liable to strike. In a conventional construction, a pipe member is mounted to an engine bracket through which an engine is mounted to a body frame, and the radiator device is mounted to the pipe member (see, for example, JP-UM-A-62-66898).

This conventional construction has a problem in that the pipe member sometimes resonates due to engine vibrations and the like, and so it is difficult to ensure sufficient support stiffness for the radiator device.

SUMMARY OF THE INVENTION

The invention has been thought of in view of the conventional situation and has provides a straddle-type vehicle that heightens support stiffness of the radiator.

A straddle-type vehicle according to the invention comprises a body frame, an engine mounted to the body frame through an engine bracket, and a radiator device arranged forwardly of the engine. A mount surface inclined rearward and downward is formed on a lower surface of a front portion of the body frame. The engine bracket extends vertically such that an upper portion of the engine bracket is mounted to the mount surface of the body frame and a lower portion of the engine bracket is mounted to a front wall of the engine. The radiator device is arranged forwardly of and mounted directly to the engine bracket.

With the straddle-type vehicle according to the invention, the radiator device is mounted to the engine bracket. The engine bracket is a member, by which the engine is suspended and supported on the body frame, and is made high in stiffness. According to the invention, the radiator device is mounted directly to the engine bracket having a high stiffness, so that its support stiffness is high as compared with the case of being mounted through a pipe member or the like.

Other features and advantages of the invention will be apparent from the following detailed description, taken in conjunction with the accompanying drawings that illustrate, by way of example, various features of embodiments of the invention.

DETAILED DESCRIPTION OF THE INVENTION

Figure 1:
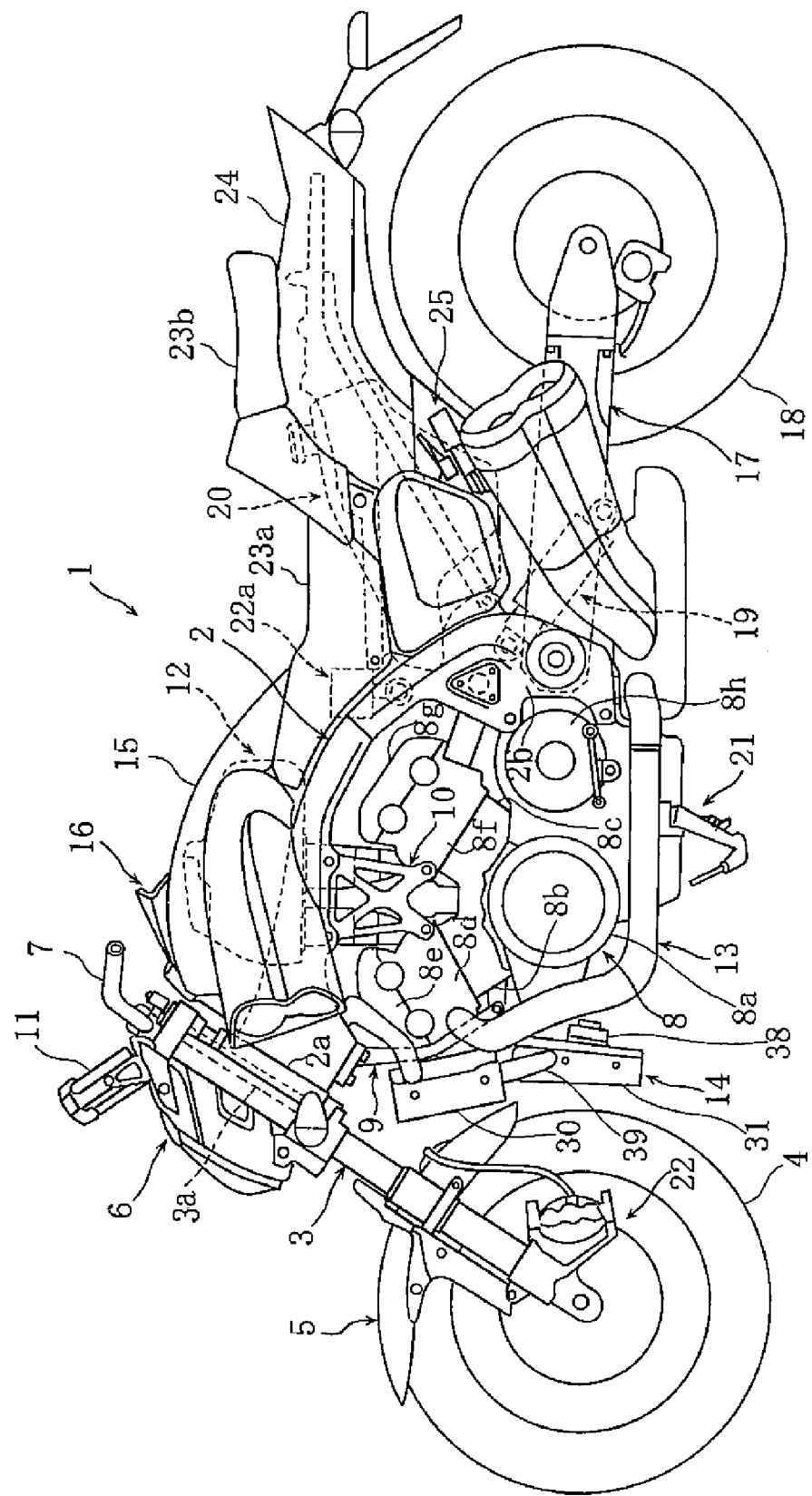
FIG. 1 is a side view of a motorcycle according to an embodiment of the invention.

An embodiment of the invention is described below with reference to the accompanying drawings.

FIGS. 1-10 illustrate a motorcycle 1 (straddle-type vehicle) according to an embodiment of the invention. Unless otherwise specified, front and rear, and left and right referred to in this description are directions from the perspective of a rider seated on a seat.

Motorcycle 1 includes a head pipe 2a positioned at a front end of a body frame 2 that journals a steering shaft 3a of a front fork 3 to be steerable left and right. A front wheel 4 is journaled at a lower end of front fork 3, and an upper portion of front wheel 4 is covered by a front fender 5 mounted to a lower portion of front fork 3.

A headlight device 6 is arranged on an upper portion of front fork 3 and a steering handle 7 is fixed at an upper end thereof. A circular-shaped meter 11 including a speedometer, a tachometer, etc. is mounted to headlight device 6 to be positioned forwardly of steering handle 7.

Body frame 2 suspends and supports an engine unit 8. An intake device 12 and an exhaust device 13 are connected to engine unit 8 and a radiator device 14 is arranged forwardly of engine unit 8. A frame cover 15 arranged on a front portion of body frame 2 covers intake device 12 from above and an indicator device 16 representative of a vehicular state is arranged on frame cover 15.

A side stand 21 is arranged on a left wall lower portion of engine unit 8 to keep motorcycle 1 upright and inclined slightly leftward.

Left and right rear arm bracket portions 2b support a rear arm 17 to swing vertically, and a rear wheel 18 is journaled by a rear end of rear arm 17. Rear wheel 18 and front wheel 4 are braked by a hydraulic brake device 22. A rear-wheel suspension 19 arranged between rear arm 17 and rear arm bracket portions 2b comprises a remote type operating characteristics adjustment mechanism 25. A fuel tank 20 is arranged above rear-wheel suspension 19. A hydraulic control unit 22a of brake device 22 is arranged obliquely forwardly of fuel tank 20.

A straddle-type main seat 23a covers upper portions of hydraulic control unit 22a and fuel tank 20, and a rear fender 24 that covers rear wheel 18 from above is arranged below a tandem seat 23b arranged rearwardly of main seat 23a.

Body frame 2 includes head pipe 2a, left and right main frame portions 2c extending rearward and obliquely downward while diverging outward in a vehicle width direction from head pipe 2a, and left and right rear arm bracket portions 2b that are contiguous to rear ends of main frame portions 2c to extend downward.

A mount surface 2e is formed on lower surfaces of front ends of main frame portions 2c close to head pipe 2a. Mount surface 2e defines an inclined surface inclined rearward and downward and is substantially flush with a lower end surface 2a' of head pipe 2a.

Engine unit 8 is a water-cooled four-stroke V-type four-cylinder engine in which a front cylinder block 8b and a rear cylinder block 8c are formed continuously fore and aft on an upper portion of a crank case 8a to define a predetermined bank angle (about 60 degrees), a front cylinder head 8d and a front head cover 8e are joined to front cylinder block 8b, and a rear cylinder head 8f and a rear head cover 8g are joined to rear cylinder block 8c. A transmission case 8h receiving therein a change gear mechanism is connected to a rear end of crank case 8a.

Figure 4:
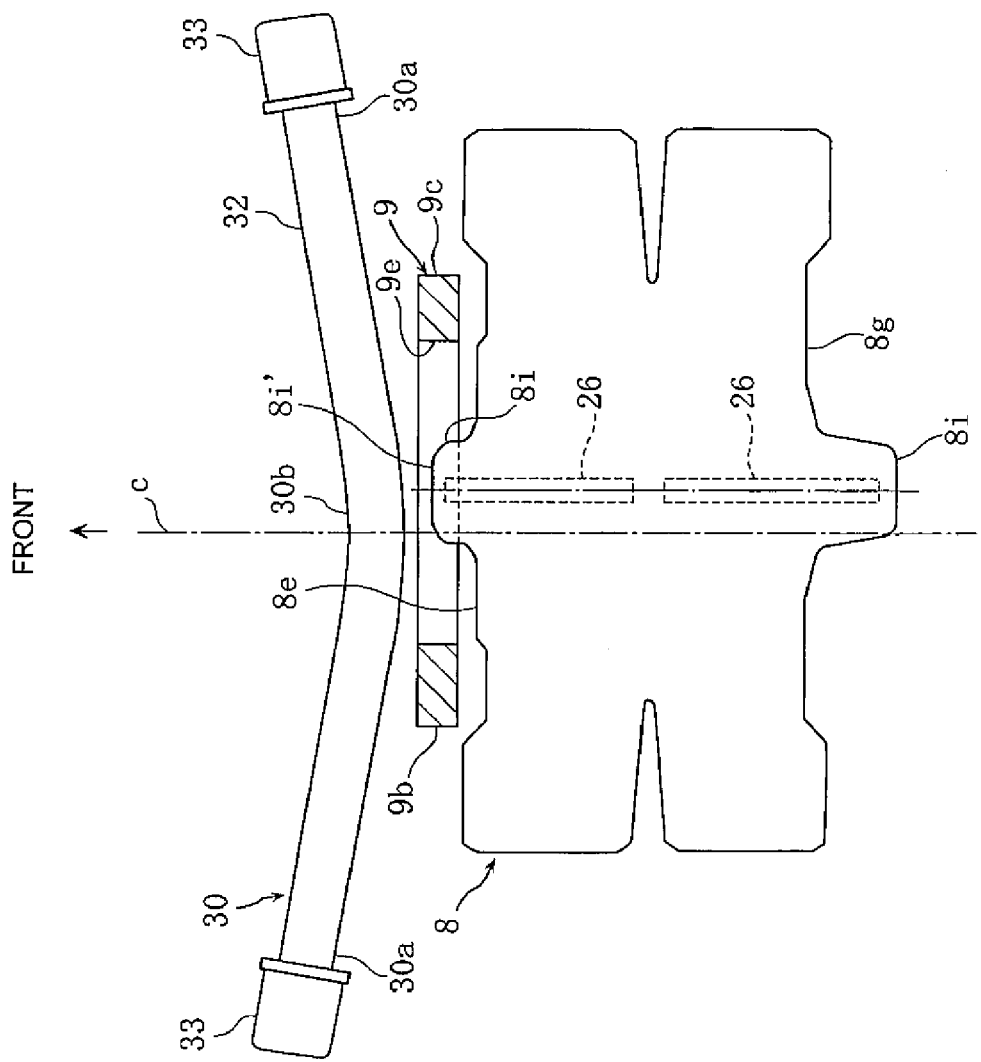
FIG. 4 is a plan view of an upper radiator of the radiator device.
Figure 5:
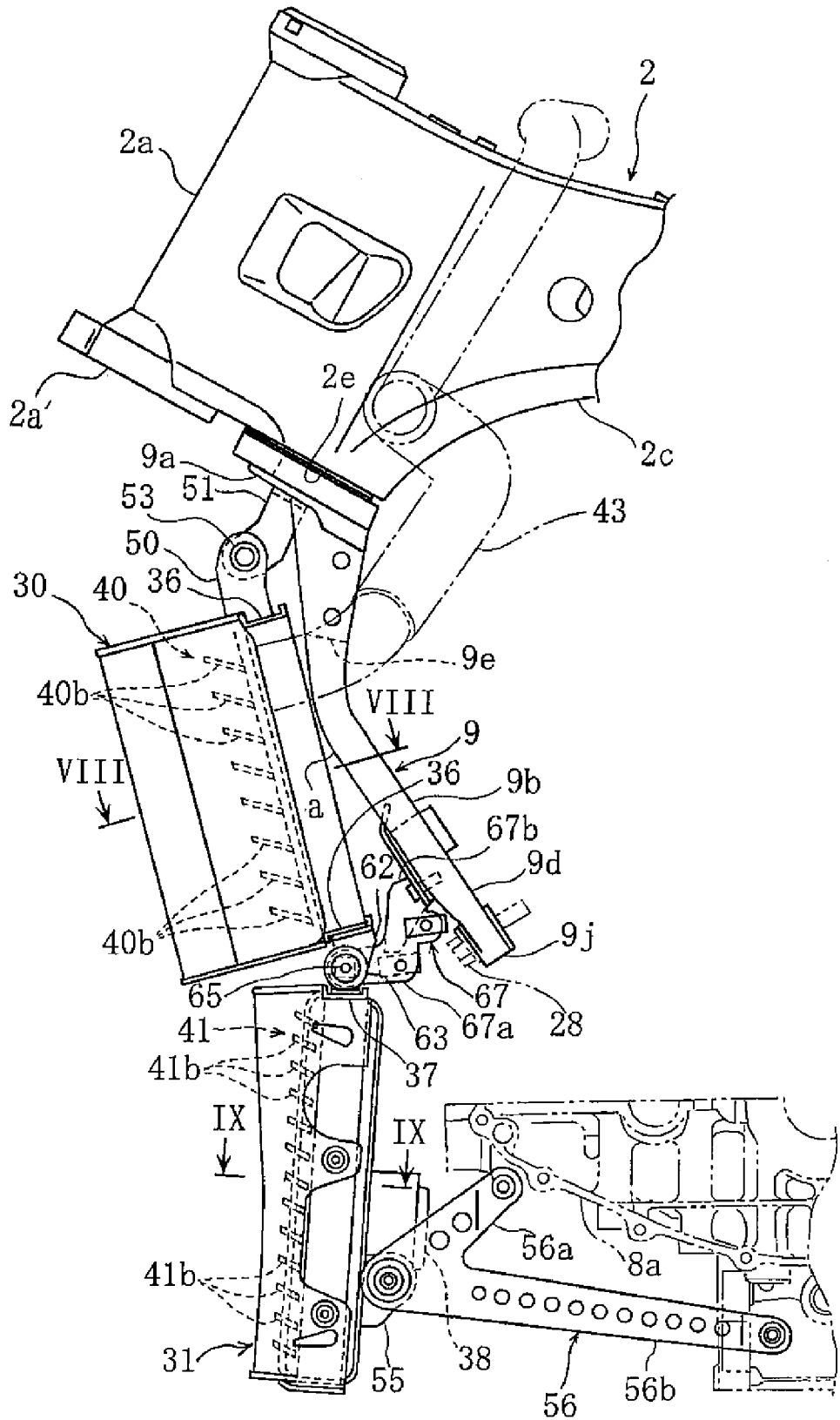
FIG. 5 is a left side view of the radiator device.

Bulged portions 8i constituting a chain chamber are formed centrally of front head cover 8e and rear head cover 8g in the vehicle width direction to bulge upward. Front and rear cam sprockets 26, around which a timing chain is wound, are accommodated in bulged portions 8i (FIG. 4).

Engine unit 8 is suspended and supported by an engine bracket 9, left and right suspension brackets 10, and left and right rear arm bracket portions 2b. Engine bracket 9 is made of a plate-shaped member that is a casting and includes a wide flange portion 9a mounted to mount surface 2e formed on the lower surfaces of the front ends of left and right main frame portions 2c, a first bracket portion 9b extending downward from a left end of flange portion 9a in the vehicle width direction, a second bracket portion 9c extending downward from a right end, and a triangular-shaped connection 9d for connection of lower ends of first bracket portion 9b and second bracket portion 9c. Connection 9d is positioned forwardly of front cylinder block 8b.

As viewed from laterally of a vehicle, flange portion 9a is inclined rearward and downward along mount surface 2e, first and second bracket portions 9b, 9c are bent in a dog-legged shape, and connection 9d is extended downward along a front wall of cylinder head 8d and cylinder block 8b.

Engine bracket 9 includes an opening 9e surrounded by flange portion 9a, first bracket portion 9b, second bracket portion 9c, and connection 9d. A front wall portion 8i' of bulged portion 8i of front head cover 8e is positioned in opening 9e. Front wall portion 8i' overlaps first bracket portion 9b and second bracket portion 9c when viewed from laterally of motorcycle 1.

Figure 10:
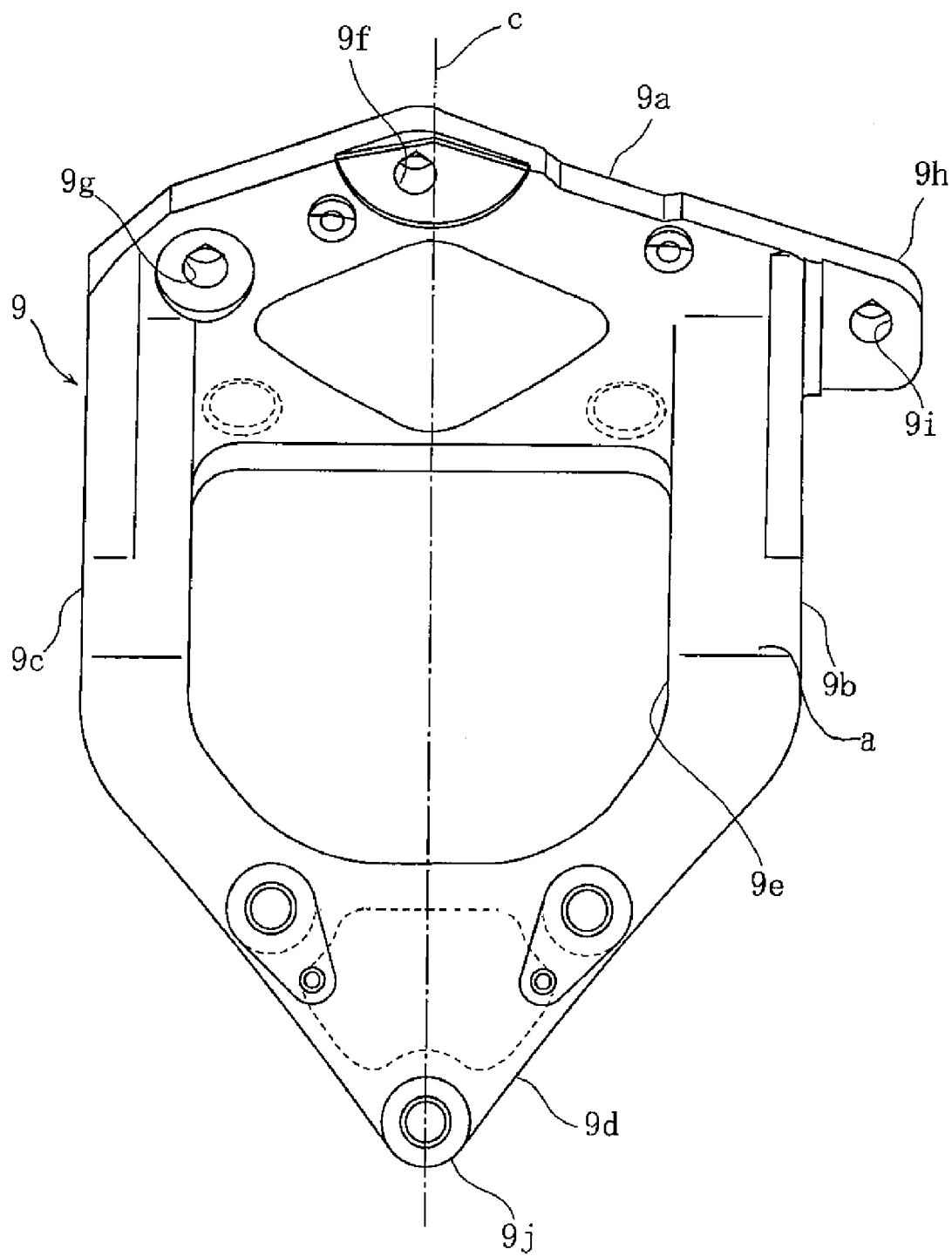
FIG. 10 is a front view of the engine bracket.

First bolt hole 9f, second bolt hole 9g and third bolt hole 9i are formed on flange portion 9a of engine bracket 9 (FIG. 10). As viewed from the front of motorcycle 1, first bolt hole 9f is formed a little offset leftwardly of a center line c of the vehicle body in the vehicle width direction, second bolt hole 9g is formed at a left end of flange portion 9a in the vehicle width direction, and third bolt hole 9i is formed on a projection 9h projecting outward from a right edge of flange portion 9a. Second bolt hole 9g and third bolt hole 9i are positioned rearward in this order from first bolt hole 9f, which is positioned at a front end (see FIG. 10).

Figure 2:
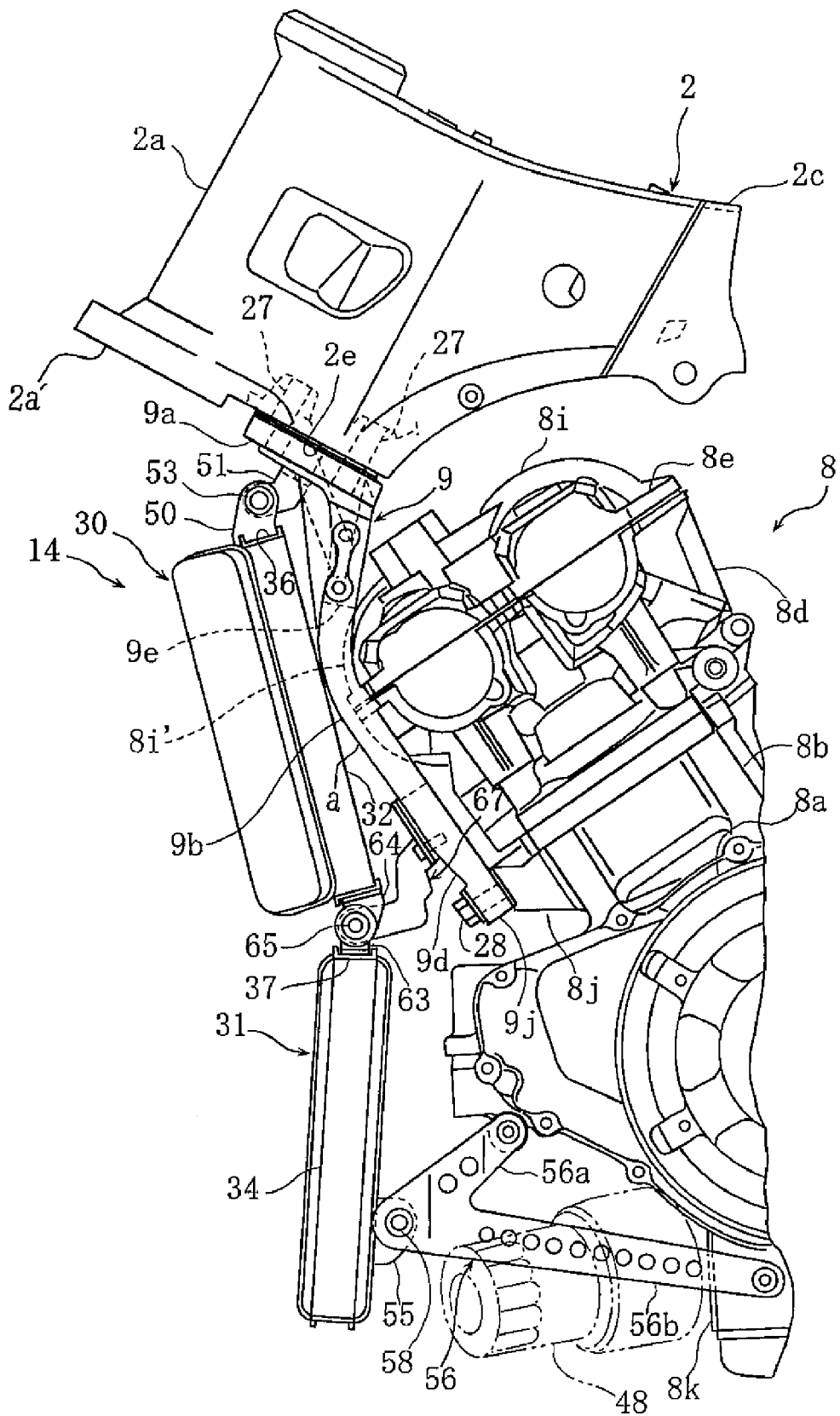
FIG. 2 is a side view of a radiator device arranged on the front surface of an engine bracket of the motorcycle.
Figure 3:
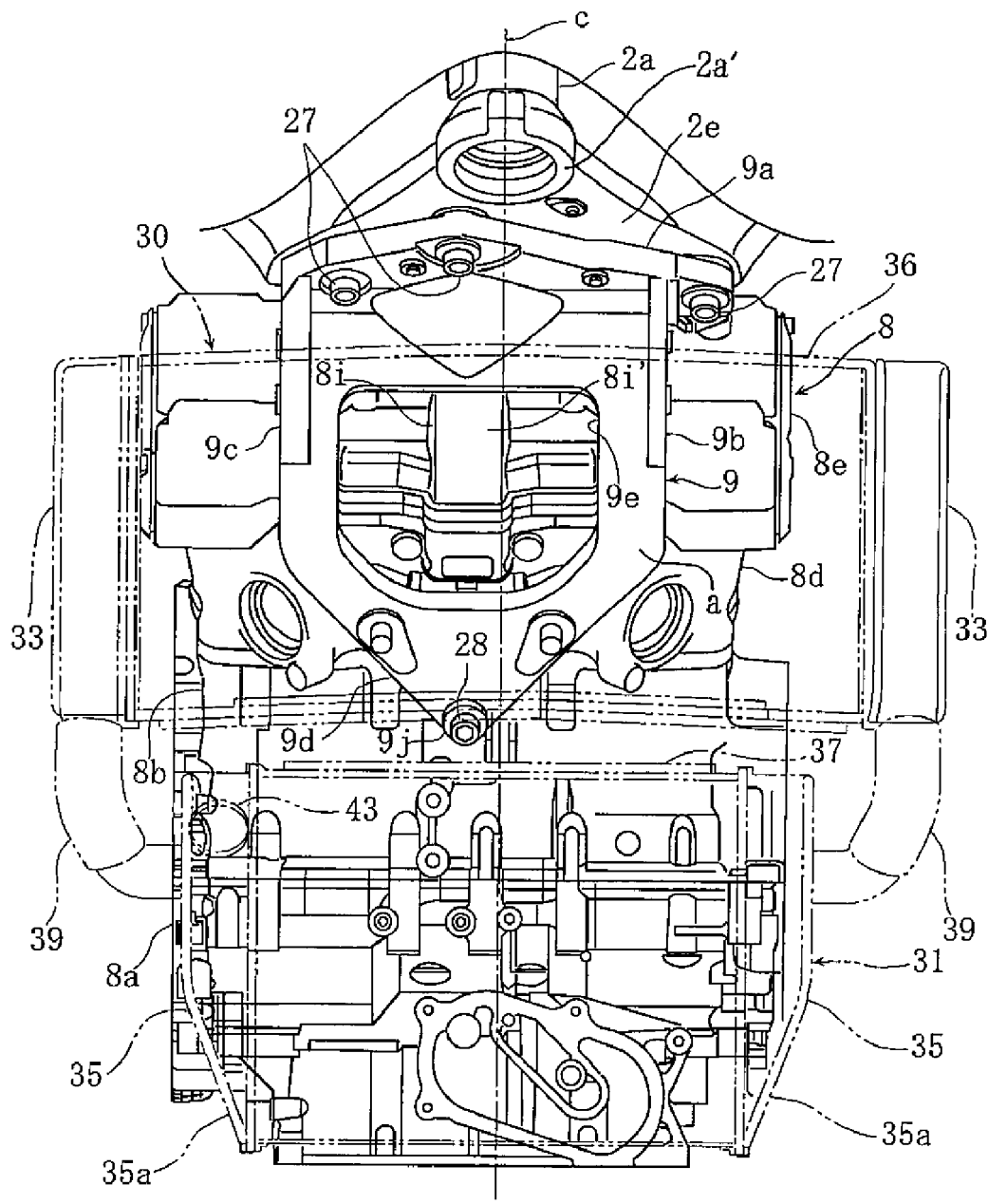
FIG. 3 is a front view of the radiator device.

Flange portion 9a of engine bracket 9 is mounted to mount surface 2e of body frame 2 by three joint bolts 27 inserted into first bolt hole 9f, second bolt hole 9g, and third bolt hole 9i from forwardly of and obliquely downwardly of motorcycle 1 (see FIGS. 2, 3 and 10). A forwardly projecting boss portion 8j is formed on the front wall of front cylinder block 8b and a lower end boss portion 9j of connection 9d of engine bracket 9 is mounted to boss portion 8j by a suspension bolt 28 inserted from the front of a vehicle (FIG. 2).

Radiator device 14 includes an upper radiator 30 positioned on an upper side and a lower radiator 31 arranged below upper radiator 30. A rectangular-shaped upper core portion 32 of upper radiator 30 covers the fronts of engine bracket 9, front cylinder head 8d and front head cover 8e and cools engine cooling water by the passage of travel wind.

Upper tank portions 33 of upper radiator 30 are connected to left and right sides of upper core portion 32 (FIG. 4). A metallic upper frame member 36 is mounted to and surrounds an outer peripheral surface of upper core portion 32 (FIGS. 3, 7).

Upper radiator 30 is curved so that left and right sides 30a are positioned toward the front of motorcycle 1 relative to a central portion 30b as viewed from above (FIG. 4), and inclined slightly forward as viewed from laterally of motorcycle 1 (FIG. 2).

Figure 7:
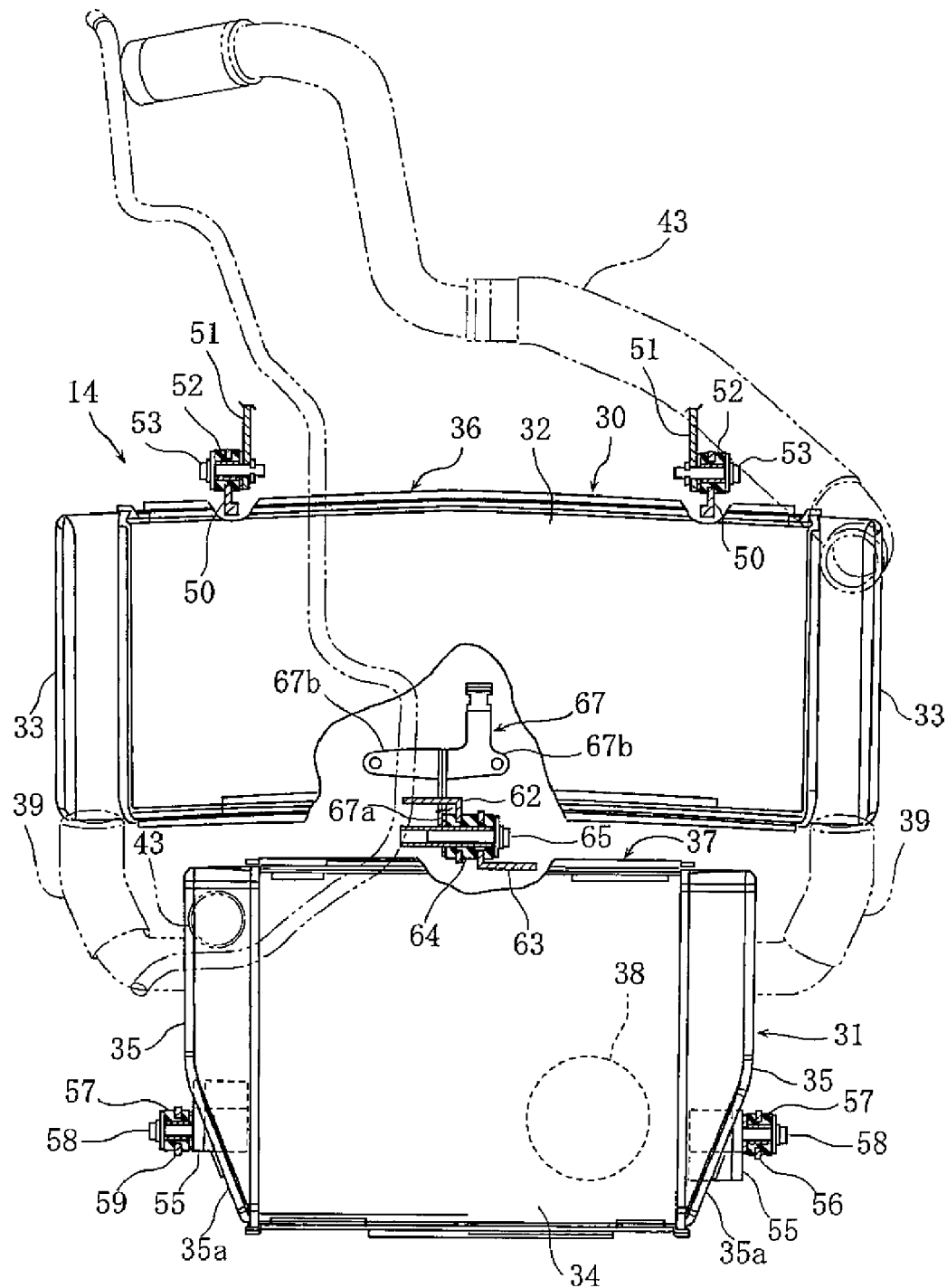
FIG. 7 is a front view of the radiator device.

Lower radiator 31 includes a rectangular-shaped lower core portion 34 that covers the front of crank case 8a, lower tank portions 35 connected to left and right end surfaces of lower core portion 34, and an electric fan 38 arranged on a left lower portion of a rear surface of lower core portion 34 (FIG. 7). A metallic lower frame member 37 is mounted to and surrounds an outer peripheral surface of lower core portion 34 (FIGS. 3, 7).

Lower radiator 31 defines a flat surface and is arranged substantially vertical as viewed from laterally. As viewed from the front of motorcycle 1, lower radiator 31 is smaller in vehicle width dimension than upper radiator 30, and the distance between lower portions 35a of lower tank portions 35 decreases in the vehicle width dimension as they go downward (FIGS. 3 and 7).

Upper tank portions 33 and lower tank portions 35 are connected to each other by left and right radiator hoses 39. Cooling water hoses 43 connected to engine unit 8 are connected to upper tank portions 33 and lower tank portions 35.

Figure 8:
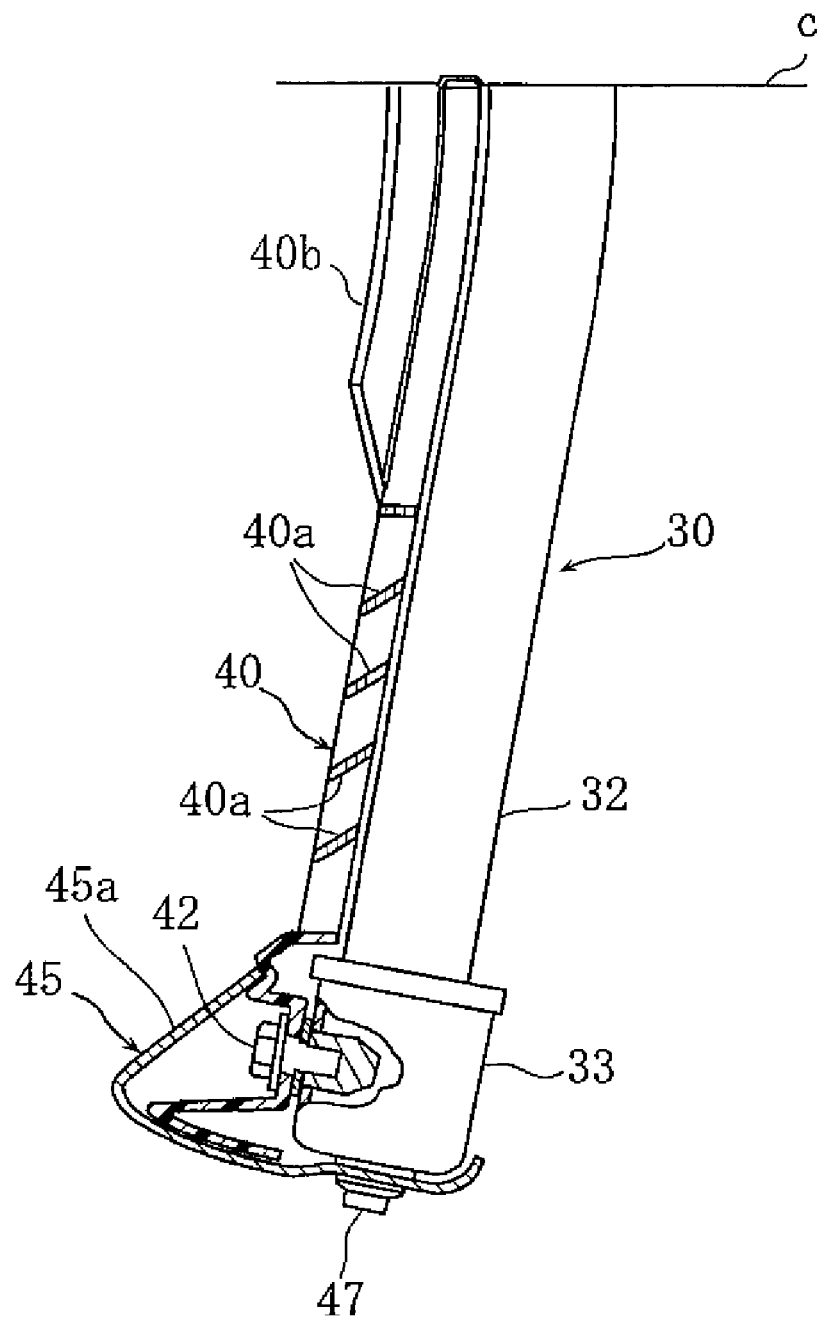
FIG. 8 is a cross sectional view taken along line VIII-VIII of FIG. 5 showing the upper radiator of the radiator device.
Figure 9:
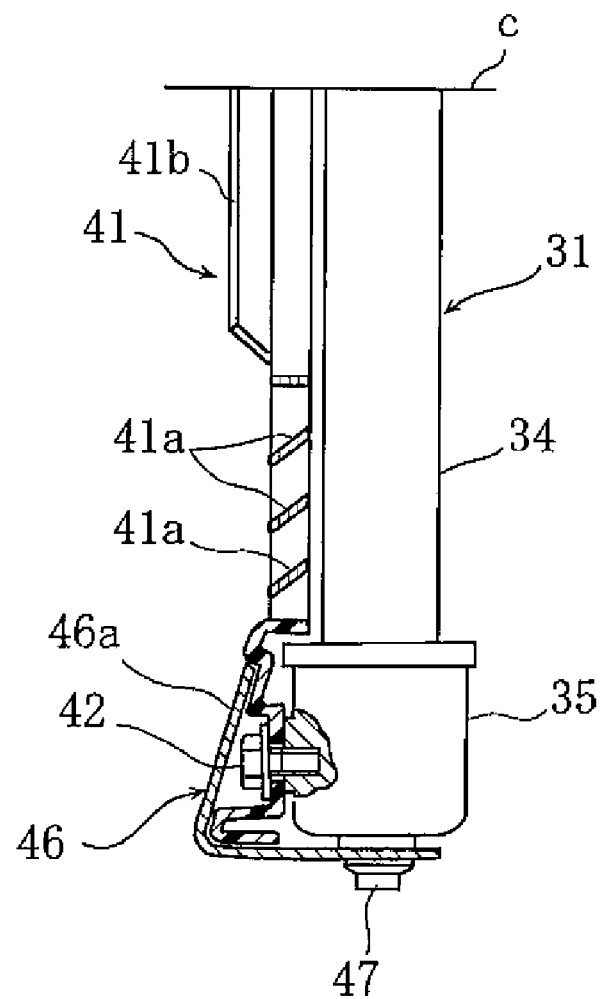
FIG. 9 is a cross sectional view taken along line IX-IX of FIG. 5 showing a lower radiator of the radiator device.

Travel wind guiding members 40, 41 are arranged on front surfaces of upper core portion 32 and lower core portion 34 and are mounted to left and right upper tank portions 33 and lower tank portions 35 by mount bolts 42 (FIGS. 8 and 9).

Travel wind guiding member 40 of upper radiator 30 is formed from a resin and includes a plurality of longitudinal louvers 40a arranged on left and right sides at predetermined intervals in the vehicle width direction to extend vertically, and a plurality of transverse louvers 40b arranged centrally in the vehicle width direction at predetermined intervals in a vertical direction to extend in the vehicle width direction. Travel wind guiding member 41 of lower radiator 31 is likewise formed from a resin and includes a plurality of longitudinal louvers 41a and a plurality of transverse louvers 41b.

Longitudinal louvers 40a, 41a are arranged outwardly obliquely to be positioned outward toward the front so as to efficiently take in travel wind from the front left, the right side, or laterally of the front wheel and to lead the travel wind to radiator core portions 32, 34. Transverse louvers 40b, 41b are arranged upwardly obliquely to efficiently lead travel wind from the front center, or above the front wheel to radiator core portions 32, 34.

Tank covers 45, 46 formed from an aluminum alloy are mounted, respectively, to front sides of left and right upper tank portions 33 and lower tank portions 35 by fixation bolts 47. Tank covers 45, 46 include, respectively, inner inclined portions 45a, 46a that lead travel wind to, respectively, longitudinal louvers 40a, 41a (FIGS. 8 and 9).

Travel wind having passed through upper core portion 32 is thereby supplied concentratedly around front cylinder head 8d and travel wind having passed through lower core portion 34 is thereby supplied concentratedly around an oil pan 8k connected to a lower surface of crank case 8a and an oil filter 48 arranged forwardly of oil pan 8k (FIG. 2).

Upper radiator 30 is mounted to engine bracket 9 and lower radiator 31 is mounted to engine bracket 9 and engine unit 8. Left and right upper stays 50 project upward from and are mounted to an upper surface of upper frame member 36 of upper radiator 30. Left and right upper brackets 51 extend forwardly and downward from and are mounted to flange portion 9a of engine bracket 9. Brackets 51 and stays 50 are mounted together through upper elastic members 52 (FIG. 7) by upper connecting bolts 53.

Lower stays 55 project rearward from and are mounted to left and right lower ends of lower frame member 37 of lower radiator 31. Left and right mount brackets 56, 59 extend forward from and are mounted to left and right wall portions of crank case 8a of engine unit 8. Mount brackets 56, 59 and stays 55 are mounted together through lower elastic members 57 by lower connecting bolts 58 (FIG. 7).

Left mount bracket 56 is substantially dog-legged in shape and includes a lower side portion 56b that is longitudinally larger than upper side portion 56a. Rear ends of upper side portion 56a and lower side portion 56b are bolted and fixed to crank case 8a, and front ends of upper side portion 56a are bolted and fixed to left lower stay 55.

Figure 6:
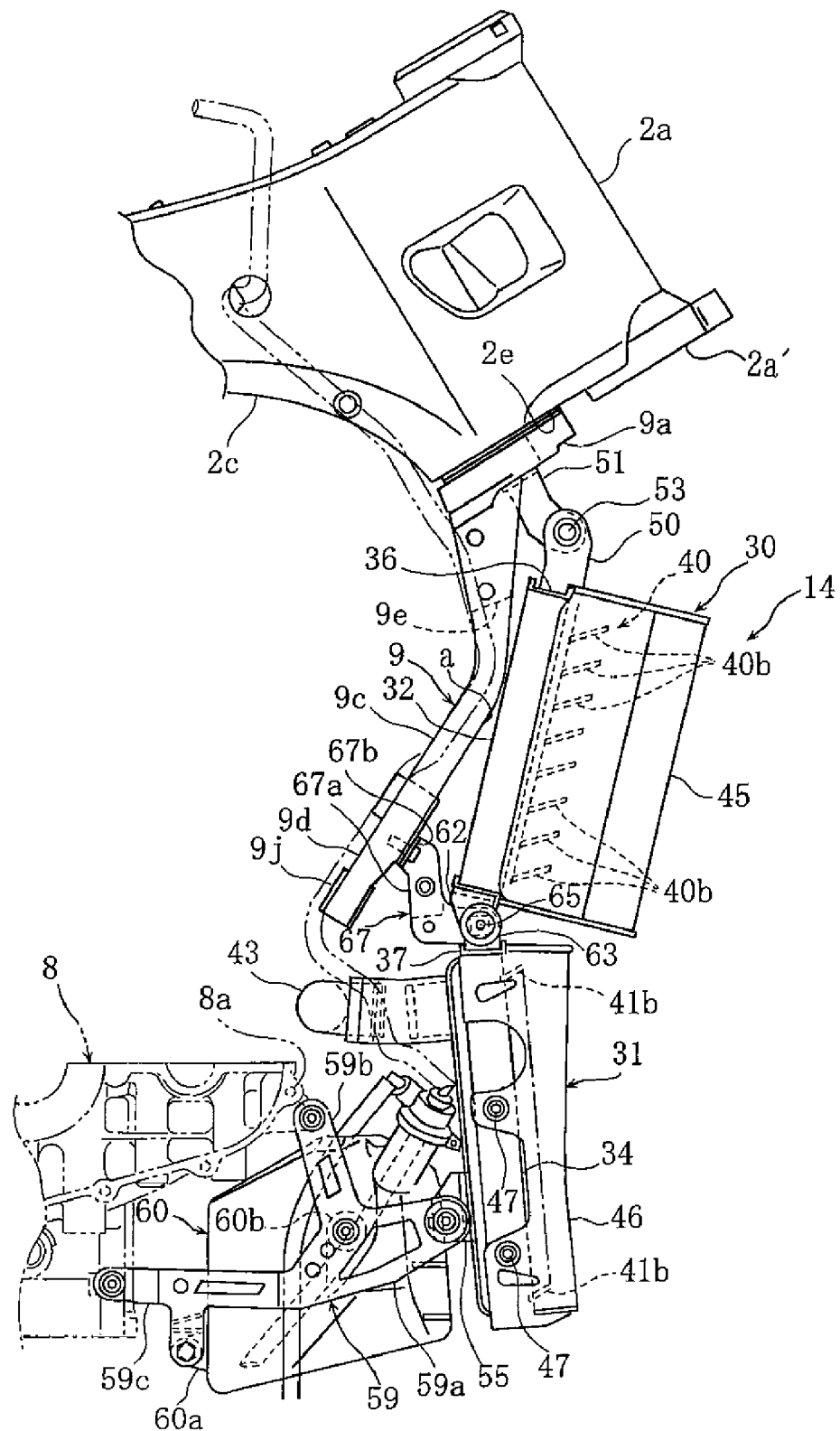
FIG. 6 is a right side view of the radiator device.

Right mount bracket 59 includes a bracket body 59a, an upper side portion 59b extending upward from bracket body 59a, and a lower side portion 59c extending rearward. Rear ends of upper side portion 59b and lower side portion 59c are bolted and fixed to crank case 8a, and front ends thereof are bolted and fixed to right lower stay 55 (FIG. 6).

A recovery tank 60 is mounted to right mount bracket 59 and is arranged inwardly of mount bracket 59 in the vehicle width direction. A mount piece 60a formed on a rear wall of tank 60 is bolted and fixed to lower side portion 59c of bracket 59. Bracket body 59a is bolted and fixed to a nut 60b insert-molded on an outer wall of tank 60.

A lower stay 62 projects downward from and is mounted to a central portion of a lower surface of upper frame member 36 in the vehicle width direction. An upper stay 63 projects upward from and is mounted to a central portion of an upper surface of lower frame member 37 in the vehicle width direction. Stays 62 and 63 are mounted together through an intermediate elastic member 64 by an intermediate connecting bolt 65 (FIG. 7).

Intermediate connecting bolt 65 and engine bracket 9 are connected to each other by a connecting bracket 67. Connecting bracket 67 includes a longitudinal bracket portion 67a extending vertically and left and right transverse bracket portions 67b extending from a rear end of longitudinal bracket portion 67a in the vehicle width direction. A rear end of longitudinal bracket portion 67a is mounted to intermediate connecting bolt 65 and left and right transverse bracket portions 67b are mounted to connection 9d of engine bracket 9. Thereby, upper radiator 30 and lower radiator 31 are connected to each other by intermediate connecting bolt 65, and connecting bolt 65 is mounted to engine bracket 9 through connecting bracket 67.

According to the embodiment, since flange portion 9a of engine bracket 9 extends vertically and is mounted to lower surfaces of front ends 2e of left and right main frame portions 2c, connection 9d is mounted to engine unit 8, and upper radiator 30 is arranged on a front surface of engine bracket 9 and is mounted to engine bracket 9, engine bracket 9 has a high stiffness and supports upper radiator 30 directly, thus improving the support stiffness of upper radiator 30.

According to the embodiment, since lower radiator 31 is mounted to engine bracket 9 and engine unit 8, engine bracket 9 and engine unit 8 have a high stiffness and support lower radiator 31 directly, thus improving the support stiffness of lower radiator 31.

Also, because mount surface 2e is inclined rearward and downward and is substantially flush with lower end surface 2a' of head pipe 2a, and possesses a sufficient longitudinal length, engine bracket 9 is heightened in support stiffness and thus heightens radiator device 14 in support stiffness.

According to the embodiment, since flange portion 9a of engine bracket 9 is mounted to left and right main frame portions 2c by three joint bolts 27 inserted from the front of the vehicle, and connection 9d is mounted to engine unit 8 by suspension bolt 28 inserted from the front of the vehicle, engine bracket 9 be readily mounted from the front of the vehicle.

Since engine bracket 9 includes first bracket portion 9b on the left and second bracket portion 9c on the right that are joined by flange portion 9a and connection 9d, the necessary stiffness is ensured while the weight of engine bracket 9 is reduced.

According to the embodiment, since front wall portion 8i' of bulged portion 8i, which constitutes a chain chamber of engine unit 8, is positioned in opening 9e of engine bracket 9, and since front wall portion 8i', first bracket portion 9b and second bracket portion 9c overlap together when viewed in the vehicle width direction, it is possible to rearwardly position engine bracket 9 and hence upper radiator 30 according to the overlapping extent. Upper radiator 30 is thereby increased in cooling capacity while interference with front fork 3, front fender 5, front wheel 4, etc. is eliminated.

Also, it is possible to decrease a center distance of a vehicle according to the overlapping extent and hence to position engine unit 8 relatively forwardly, so that the front-wheel load is increased and the weight balance of the whole vehicle is more favorable.

According to the embodiment, division of the radiator into upper radiator 30 and lower radiator 31 improves assembly into a vehicle body while necessary cooling capacity is ensured.

Since electric fan 38 is arranged on lower radiator 31, electric fan 38 can be arranged in an empty space between lower radiator 31 and engine unit 8. Hence, upper radiator 30 can be positioned further rearwardly. That is, when the electric fan is arranged on upper radiator 30, upper radiator 30 must be positioned forward according to the extent of the electric fan, and a decrease in cooling capacity is necessary in order to avoid interference with front fender 5.

According to the embodiment, since upper radiator 30 and lower radiator 31 are connected to each other by intermediate, connecting bolt 65 and intermediate, connecting bolt 65 is mounted to engine bracket 9 through connecting bracket 67, the connection between upper radiator 30 and lower radiator 31 is increased in strength and simple in structure.

This embodiment has been described with reference to a motorcycle as an example. However, the invention is also applicable to other vehicles such as motor tricycles and four-wheel cars on which a straddle-type seat is mounted, and straddle-type vehicles for terrain traveling.

The invention claimed is:

1. A straddle-type vehicle comprising:
   a body frame;
   an engine mounted to the body frame through an engine bracket; and
   a radiator device arranged forwardly of the engine, wherein
   a mount surface inclined rearward and downward is formed on a lower surface of a front portion of the body frame,
   the engine bracket extends vertically to have an upper portion thereof mounted to the mount surface of the body frame and to have a lower portion thereof mounted to a front wall of the engine, and
   the radiator device is arranged forwardly of and mounted directly to the engine bracket.

2. The straddle-type vehicle according to claim 1, wherein
a head pipe is arranged on a front portion of the body frame and supports a steering shaft, and
the mount surface is substantially flush with a lower end surface of the head pipe.

3. The straddle-type vehicle according to claim 1, wherein the radiator device is arranged along a front surface of the engine bracket.

4. The straddle-type vehicle according to claim 1, wherein the engine bracket is mounted to the body frame and the engine by a clamp member inserted from the front of the vehicle.

5. The straddle-type vehicle according to claim 4, wherein
a head pipe is arranged on a front portion of the body frame and supports a steering shaft, and
the clamp member mounts an upper portion of the engine bracket to the mount surface and is directed substantially in parallel to the steering shaft.

6. The straddle-type vehicle according to claim 1, wherein
the engine bracket includes a first bracket portion positioned on one side in a vehicle width direction and a second bracket portion positioned on an opposite side, and
the first and second bracket portions are made integral.

7. The straddle-type vehicle according to claim 6, wherein
the engine bracket comprises a plate-shaped member having an opening, and
a left edge of the opening defines the first bracket portion and a right edge of the opening defines the second bracket portion.

8. The straddle-type vehicle according to claim 7, wherein
the engine includes a front wall portion of a chain chamber that projects forward, and
a front wall portion of the engine is positioned in the opening and overlaps the engine bracket as viewed from laterally of the vehicle.

9. The straddle-type vehicle according to claim 1, wherein the radiator device includes an upper radiator and a lower radiator.

10. The straddle-type vehicle according to claim 9, wherein
the upper radiator is mounted to the engine bracket, and
the lower radiator is mounted to the engine bracket and the engine.

11. The straddle-type vehicle according to claim 10, wherein
the upper radiator and the lower radiator are connected to each other by a connection member, and
the connection member is mounted to the engine bracket.

* * * * *